(12) United States Patent
Gu et al.

(10) Patent No.: US 7,432,141 B2
(45) Date of Patent: Oct. 7, 2008

(54) LARGE-GRAIN P-DOPED POLYSILICON FILMS FOR USE IN THIN FILM TRANSISTORS

(75) Inventors: Shuo Gu, Fremont, CA (US); Sucheta Nallamothu, San Jose, CA (US)

(73) Assignee: SanDisk 3D LLC, Milpitas, CA (US)

( * ) Notice: Subject to any disclaimer, the term of this patent is extended or adjusted under 35 U.S.C. 154(b) by 119 days.

(21) Appl. No.: 10/936,168

(22) Filed: Sep. 8, 2004

(65) Prior Publication Data

US 2006/0051911 A1    Mar. 9, 2006

(51) Int. Cl.
*H01L 21/00* (2006.01)
(52) U.S. Cl. .................. 438/166; 438/217; 438/514; 257/E21.133; 257/E21.413; 257/E21.423
(58) Field of Classification Search .......... 257/E21.179, 257/E21.18, E21.182, E21.133, E21.413, 257/E21.423; 438/166, 155, 217, 514
See application file for complete search history.

(56) References Cited

U.S. PATENT DOCUMENTS

| | | | | |
|---|---|---|---|---|
| 6,034,882 | A * | 3/2000 | Johnson et al. | 365/103 |
| 6,162,711 | A * | 12/2000 | Ma et al. | 438/558 |
| 6,235,563 | B1 * | 5/2001 | Oka et al. | 438/166 |
| 6,403,497 | B1 * | 6/2002 | Oka et al. | 438/770 |
| 6,570,184 | B2 * | 5/2003 | Horikoshi et al. | 257/72 |
| 6,713,371 | B1 | 3/2004 | Gu | |
| 6,905,963 | B2 * | 6/2005 | Noda et al. | 438/684 |
| 6,956,278 | B2 * | 10/2005 | Herner | 257/530 |
| 2002/0132452 | A1 | 9/2002 | Oka et al. | |
| 2004/0033648 | A1 * | 2/2004 | Matsunaga et al. | 438/154 |
| 2004/0046209 | A1 * | 3/2004 | Sera et al. | 257/350 |
| 2005/0072976 | A1 | 4/2005 | Cleeves et al. | |

OTHER PUBLICATIONS

Fan, C.L., et al.,"Fabrication of High Performance Low-Temperature Poly-Si Thin-Film Transistors Using a Modulated Process", *J. Electrochem.Soc.*, vol. 149, (2002),H93-H97.
Nam, K.S., et al.,"Thin-Film Transistors with Polycrystalline Silicon Prepared by a New Annealing Method", *Jpn. J. Appl. Phys. Part 1*, vol. 32, (1993), 1908-1912.

(Continued)

*Primary Examiner*—Michael S. Lebentritt
*Assistant Examiner*—Stanetta D Isaac
(74) *Attorney, Agent, or Firm*—Foley & Lardner LLP

(57) ABSTRACT

A method is disclosed to form a large-grain, lightly p-doped polysilicon film suitable for use as a channel region in thin film transistors. The film is preferably deposited lightly in situ doped with boron atoms by an LPCVD method at temperatures sufficiently low that the film is amorphous as deposited. After deposition, such a film contains an advantageous balance of boron, which promotes crystallization, and hydrogen, which retards crystallization. The film is then preferably crystallized by a low-temperature anneal at, for example, about 560 degrees for about twelve hours. Alternatively, crystallization may occur during an oxidation step performed, for example at about 825 degrees for about sixty seconds. The oxidation step forms a gate oxide for a thin film transistor device, for example a tunneling oxide for a SONOS memory thin film transistor device.

51 Claims, 5 Drawing Sheets

OTHER PUBLICATIONS

Subramanian, V., et al.,"Controlled Two-Step Solid-Phase Crystallization for High-Performance Polysilicon TFTs", *IEEE Electron Device Letters*, vol. 18, (1997), 378-381.

Subramanian, V., et al.,"High-Performance Germanium-Seeded Laterally Crystallized TFT's for Vertical Device Integration", *IEEE Transactions on Electron Devices*, vol. 45, (1998), 1934-1939.

Subramanian, V., et al.,"Low-leakage Germanium-Seeded Laterally-Crystallized Single-Grain 100-nm TFT's for Vertical Integration Applications", *IEEE Electron Device Letters*, vol. 20, (1999), 341-343.

Wang, H., et al.,"Super Thin-Film Transistor with SOI CMOS Performance Formed by a Novel Grain Enhancement Method", *IEEE Transaction on Electron Devices*, vol. 47, (2000), 1580-1586.

* cited by examiner

LARGE-GRAIN P-DOPED POLYSILICON FILMS FOR USE IN THIN FILM TRANSISTORS

BACKGROUND OF THE INVENTION

The invention relates to a method for forming a large-grain polycrystalline silicon film for use in thin film transistors, the film doped with a p-type dopant.

Thin film transistors are conventionally formed in silicon deposited over a substrate, often glass. Since the silicon is not epitaxially grown, it is not monocrystalline. Instead it is typically polycrystalline silicon, herein referred to as polysilicon.

Transistors formed in single-crystal silicon have no grain boundaries in the channel region. However, when the channel region of a transistor is formed in a polysilicon layer, grain boundaries in the polysilicon tend to decrease carrier mobility, degrading device performance. It is advantageous, therefore, to increase grain size, decreasing the number of grain boundaries.

Methods typically used to increase grain size include the introduction of catalysts, such as nickel or germanium, and laser annealing. Both of these methods have disadvantages.

One type of transistor that may be formed in polysilicon has a channel region lightly doped with a p-type dopant. This layer is conventionally formed by depositing an undoped film, then doping it using ion implantation. It would be advantageous to avoid this implantation step.

There is a need, therefore, to increase grain size in p-doped films to be used in thin film transistors without introducing metal catalysts or using laser annealing methods.

SUMMARY OF THE PREFERRED EMBODIMENTS

The present invention is defined by the following claims, and nothing in this section should be taken as a limitation on those claims. In general, the invention is directed to a method to form a large-grain lightly p-doped silicon film for use in thin film transistors.

A first aspect of the invention provides for a method for forming a thin film transistor, the method comprising depositing an amorphous semiconductor film, the film in situ doped with a p-type dopant; thermally crystallizing the amorphous film to a polycrystalline film; and forming the thin film transistor, wherein the polycrystalline film serves as a channel region of the thin film transistor.

Another aspect of the invention provides for a method for forming an array of thin film transistors, the method comprising depositing an amorphous semiconductor film wherein the film is in situ doped with a p-type dopant; crystallizing the film; and forming a plurality of thin film transistors, each thin film transistor comprising a channel region, each channel region comprising a portion of the crystallized film.

A related aspect of the invention provides for a method for forming an array of thin film transistors, the method comprising depositing an amorphous silicon film wherein the film is in situ doped with a p-type dopant; crystallizing the film wherein p-type dopant atoms are substantially the only catalyzing agent in contact with or incorporated in the film; and forming a plurality of thin film transistors wherein a channel region of each transistor comprises a portion of the crystallized film.

An embodiment of the invention provides for a method for forming a monolithic three dimensional memory array of thin film transistors, the method comprising depositing a first amorphous silicon film wherein the first film is in situ doped with a p-type dopant; crystallizing the first silicon film; forming a first plurality of thin film transistors wherein each transistor comprises a channel region, the channel region of each first transistor formed in a portion of the first film; and monolithically forming a second plurality of thin film transistors above the first plurality.

Yet another aspect of the invention provides for a device level of thin film transistors comprising an in situ doped polycrystalline film doped with a p-type dopant, wherein the film is fully polycrystalline including substantially no amorphous regions; and a plurality of thin film transistors, wherein the film comprises a plurality of channel regions of the plurality of thin film transistors, and at least about 90 percent by volume of the film consists of grains larger than about 0.2 microns, and wherein the film comprises substantially no catalytic metal.

Another aspect of the invention provides for a monolithic three dimensional memory array of thin film transistors comprising a monocrystalline substrate; a first level of thin film transistors monolithically formed above the substrate, wherein channel regions of the first level of thin film transistors are formed in a first polycrystalline semiconductor film, wherein the first polycrystalline semiconductor film is in situ doped with a p-type dopant, and wherein at least about 90 percent by volume of the first polycrystalline film consists of grains larger than about 0.2 microns; a second level of thin film transistors monolithically formed above the first level of thin film transistors.

Each of the aspects and embodiments of the invention described herein can be used alone or in combination with one another.

The preferred aspects and embodiments will now be described with reference to the attached drawings.

DETAILED DESCRIPTION OF THE PREFERRED EMBODIMENTS

One of the major obstacles to the use of polysilicon thin film as a semiconductor in active devices is the relatively small grain sizes (around 0.05 micron or less) of polysilicon thin films deposited by such methods as low-pressure chemical vapor deposition (LPCVD) and sputtering. The larger number of grain boundaries in such a film decreases carrier mobility; typical electron mobilities in polysilicon films made using conventional LPCVD methods are on the order of 10 $cm^2$/volt-second, two orders of magnitude lower than electron mobilities in single crystal silicon.

The poor electrical performance caused by grain boundaries in the channel region largely limits the use of thin film transistors to low-temperature flat panel displays. It is believed that electrical properties of thin film transistors can be improved if the grain size is enhanced and the number of grain boundaries in the channel region minimized.

Laser annealing of polycrystalline or amorphous silicon has been used to improve carrier mobilities, but it is difficult to determine and control the temperature of thin films during laser anneal, and substrates can be thermally damaged by this process.

Metal-induced crystallization has shown great promise in increasing grain size. Metal nuclei or patterned strips deposited or formed on the surface of amorphous silicon seed formation of silicon grains. This method may lead to metal contamination, however, which degrades device performance.

A method using silicon nuclei to seed controlled crystallization of an amorphous film is described in Gu, U.S. Pat. No. 6,713,371, "Large Grain Size Polysilicon Films Formed by Nuclei-Induced Solid Phase Crystallization," hereby incorporated by reference in its entirety. Gu et al., U.S. patent application Ser. No. 10/681,509, "Uniform Seeding to Control Grain and Defect Density of Crystallized Silicon for Use in Sub-micron Thin Film Transistors," filed Oct. 7, 2003 and hereby incorporated by reference, teach the use of seeding crystallizing agents on an amorphous layer at uniform intervals.

Figure 1:
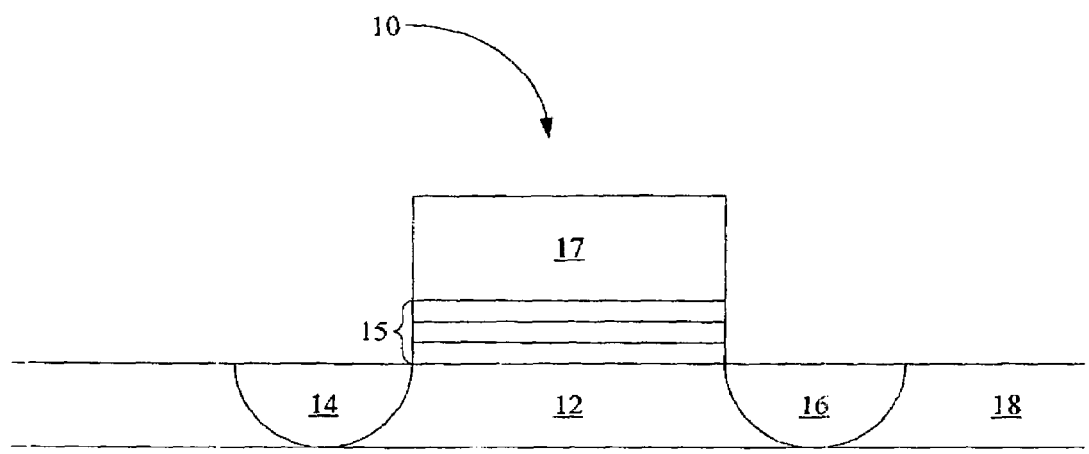
FIG. 1 is a cross-sectional view of an exemplary thin film transistor having a lightly p-doped channel region and n-doped source and drain regions.

Turning to FIG. 1, thin film transistor 10 includes lightly p-doped channel region 12 and n-doped source 14 and drain 16. Polysilicon layer 18, in which channel region 12 and source 14 and drain 16 are formed, can be formed and doped using a variety of methods. (Gate dielectric 15 and gate electrode 17 complete thin film transistor 10.) Plasma-enhanced chemical vapor deposition can be used to deposit layer 18 in an amorphous state relatively quickly, compared to forming the same film by LPCVD, but plasma deposition incorporates higher levels of hydrogen into the film. Hydrogen tends to retard crystallization, so hydrogen will have to be removed from a plasma-deposited film before it can easily be crystallized by a subsequent anneal. Such a method to drive off hydrogen from a plasma-deposited film in a first, low temperature anneal prior to a second, crystallizing anneal performed at a higher temperature is described by Oka et al., U.S. Patent Publication No. 20020132452, "Semiconductor Device and Method of Manufacturing the Same." The film of Oka et al. is undoped.

It is conventional to deposit polysilicon layer 18 undoped, then to introduce dopants by ion implantation. The most commonly used p-type dopant is boron, and boron atoms tend to promote nucleation. If polysilicon layer 18 is doped by in situ doping, in which a gas providing boron is flowed along with the gas providing silicon atoms so that boron atoms are distributed evenly throughout the film during deposition, the boron atoms will tend to promote nucleation; thus care must be taken to make sure the film is amorphous as deposited. If conditions are such that layer 18 is polycrystalline as deposited, the grain size will be small, and the film cannot be recrystallized using the solid phase crystallization techniques mentioned so far.

Several factors, then, must be balanced to deposit, dope, and crystallize a silicon layer to create a large-grain, lightly p-doped film, including rate of deposition, degree of hydrogen incorporation, and when and how to introduce p-type dopant atoms.

In the present invention, an amorphous silicon layer is deposited, preferably by LPCVD, and in situ doped with a p-type dopant. The film is formed with an advantageous balance of the p-type dopant (specifically boron atoms) and hydrogen. This balance assures that during a subsequent thermal anneal step, nucleation does not occur too quickly (creating too many nucleation sites and thus forming small crystals), nor does crystallization occur too slowly (making device production impractical.) No additional crystallization methods such as metal catalysts or laser annealing need be employed.

An example of formation of a thin film transistor formed according to the present invention will now be provided. For clarity, specific details describing process conditions will be provided. It will be understood, however, that such details are not intended to be limiting, and steps and conditions can be added, changed, or omitted while the results still fall within the scope of the invention.

EXAMPLE

Figure 2A:
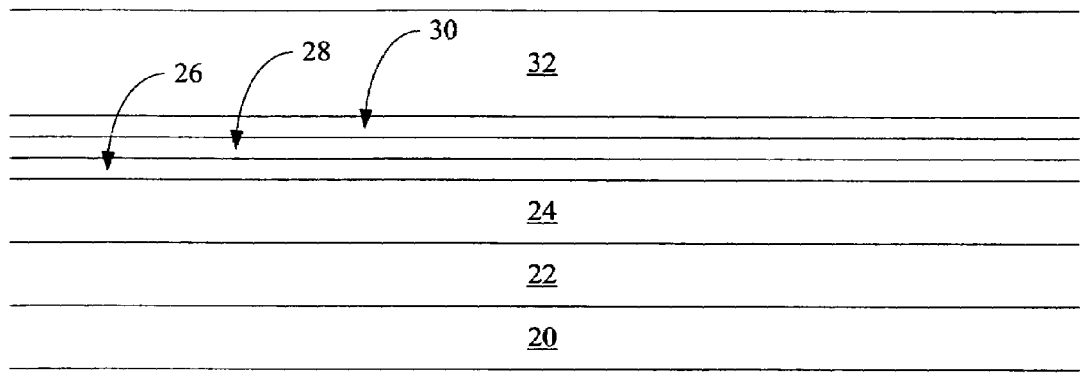
FIGS. 2a and 2b are cross-sectional views showing steps in formation of a thin film transistor according to the present invention.

Formation of a thin film transistor according to the present invention begins with a substrate 20, shown in FIG. 2a. The substrate can be any suitable material. In some embodiments, it can be a monocrystalline silicon wafer. Circuitry, for example CMOS, can be formed in the wafer before fabrication of the thin film transistor begins. A dielectric layer 22, for example silicon dioxide, isolates subsequent layers from substrate 20. Layers 20 and 22 are a representation of one possibility; additional layers may be present, of course.

Silicon layer 24 is deposited by an LPCVD process. The layer should be in situ doped with a p-type dopant, preferably boron, and can be formed by simultaneously flowing a gas that will donate silicon atoms, for example silane ($SiH_4$), and a gas that will donate boron atoms, for example $BCl_3$, though other gases can be used. The silane can be flowed at any suitable rate, for example at 500 sccm, while the $BCl_3$ should be provided at a very low rate. For example, $BCl_3$ can be diluted at 10 ppm in helium, argon, or some other inert gas; for example a helium-$BCl_3$ combination can be flowed at 5-10 sccm. Deposition temperatures can range from about 460 to about 530 degrees C. Preferred deposition temperatures are between about 460 and about 530 degrees C., more preferably between about 460 and about 520 degrees C., most preferably between about 460 and about 510 degrees C. The resulting film preferably has a dopant concentration between about $2 \times 10^{17}$ and about $2 \times 10^{18}$ atoms/$cm^3$, more preferably between about $4 \times 10^{17}$ and about $1 \times 10^{18}$ atoms/$cm^3$. Pressure during deposition preferably ranges between about 350 and about 1400 mTorr, more preferably between about 1000 to about 1400 mTorr.

Deposition can be performed in any appropriate chamber, for example in an ASML RVP-300 LPCVD system, which is a vertical furnace capable of holding 80 wafers with a pitch of 8.6 mm in a quartz boat.

Temperature, pressure, and dopant concentration all affect deposition rate and the quality and composition of the resulting film in known ways. Increasing temperature and dopant concentration both tend to increase deposition rate which is advantageous to improve production throughput, but also increase nucleation, reducing grain size. The film should be deposited amorphous, allowing for subsequent controlled crystallization, so neither temperature nor dopant concentration can be allowed to be too high. A film deposited at lower temperature will have higher amounts of hydrogen included, retarding nucleation and allowing formation of larger crystals during the subsequent anneal step. Higher pressure during deposition improves the quality of the film after anneal (also by increasing hydrogen incorporation) and increases deposition rate. As pressure gets higher, however, uniformity of the film across the wafer and across wafers in the boat begins to degrade. Within the ranges provided, dopant concentration, temperature and pressure can be balanced in ways that will be understood by the skilled practitioner; for example a decrease in deposition temperature can allow for an increase in dopant concentration, and vice versa. The silicon layer can be any desired thickness, for example between 500 and 1000 angstroms.

An amorphous silicon layer formed as described by LPCVD will contain hydrogen, though far less hydrogen than a silicon layer deposited by a plasma-enhanced deposition process. As noted, hydrogen inhibits nucleation; thus the hydrogen content of the silicon film influences the eventual grain size achieved. Films deposited at lower temperature have higher hydrogen content after deposition. A film deposited at 510 degrees C. had a hydrogen concentration of $3 \times 10^{19}$ atoms/cm$^3$, while the hydrogen concentration of a film deposited at 460 degrees C. was $6 \times 10^{19}$ atoms/cm$^3$.

Two different methods were used to anneal the silicon layer formed as described, the first a relatively slow, low-temperature anneal, the second a relatively fast higher-temperature anneal. Both are solid-phase crystallization methods. Each will be described in turn.

Low Temperature Anneal

A silicon layer formed according to the present invention was annealed at a relatively low temperature. In one example, the low temperature anneal was performed at 560 degrees C. The anneal temperature is preferably between about 540 and 650 degrees C. The wafers were annealed in a nitrogen atmosphere for twelve hours under atmospheric pressure. Wafers could be annealed for a longer period, for example up to 24 hours. The wafers were not observed until the end of the twelve hour anneal, at which time they were fully crystallized. It is possible that crystallization was complete earlier, and that a shorter anneal time, for example between six and twelve hours, might suffice. Note that, unlike in Oka et al., there is no need in the present invention for a first anneal to drive off excess hydrogen before the crystallizing anneal.

After the anneal, the entire silicon layer was fully crystallized across the wafer surface. The grain size ranged from 0.2 to 0.5 microns after the anneal was complete. When the film was deposited at 460 degrees, after anneal at least 90 percent of the film consisted of grains larger than about 0.2 microns.

Figure 3A:
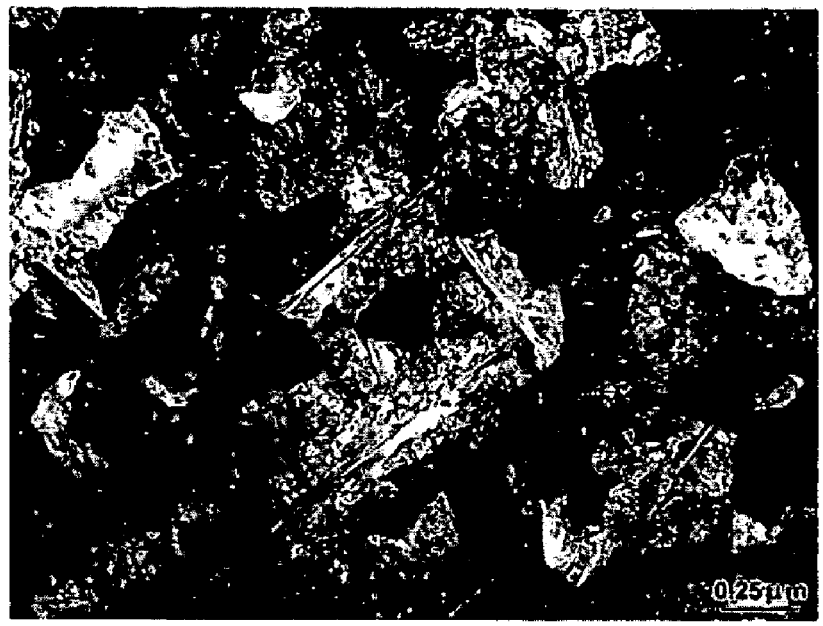
FIGS. 3a, 3b, and 3c are TEM top view images of crystallized silicon films deposited and annealed at different conditions according to the present invention.
Figure 3B:
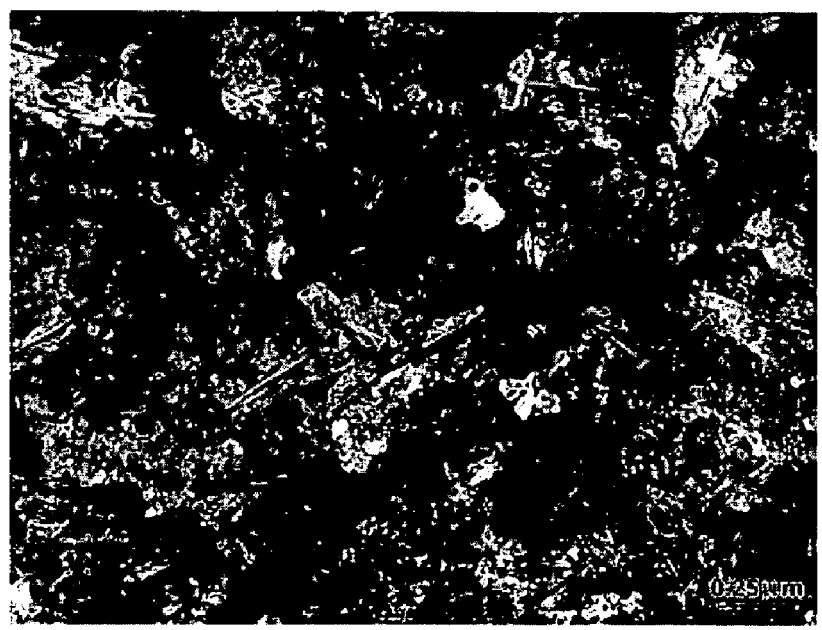

It was found that films deposited at lower temperature had larger grain size when the anneal was complete. For example, FIG. 3a is a TEM top view image of a film deposited at 460 degrees C. and annealed in a nitrogen atmosphere for twelve hours at 560 degrees C. FIG. 3b is a TEM top view image of a film deposited at 510 degrees C. and annealed in the same conditions. The film deposited at 460 degrees C. has larger grain sizes and more uniform distribution. It is believed that the larger grain size of the film deposited at lower temperature was due to a higher amount of incorporated hydrogen in the film at the beginning of the anneal.

It has been noted that lower deposition temperature, for example 460 degrees C., has the disadvantage of lower deposition rate. In one example, the deposition rate at about 460 degrees C. was about 1.11 angstroms/minute, while the deposition rate at about 510 degrees C. was ten times faster, about 11.67 angstroms/minute. Thus it may prove advantageous to deposit the film at a temperature higher than 460 degrees, and then, before the anneal, implant hydrogen to increase hydrogen content of the film. Such an implant may be performed, for example, by exposing the deposited silicon layer to a hydrogen-containing plasma, preferably with high bias voltage between wafer and plasma.

Higher Temperature Anneal

Alternatively, a silicon layer formed on a wafer according to the present invention can be crystallized at a higher temperature. Rather than performing a separate anneal step, a thin layer of silicon oxide can be grown on the silicon layer by exposing it to an oxygen-containing atmosphere at a temperature between about 800 and about 900 degrees C. for a period between about 45 and about 90 seconds. In one example, oxidation was performed at about 825 degrees C. for about 60 seconds, forming an oxide layer about 2.5 nanometers thick. The advantage of this form of anneal is that it is not performed as a separate anneal step, but rather as the next step in device formation. The oxide layer can serve as a high-quality gate oxide.

Figure 3C:
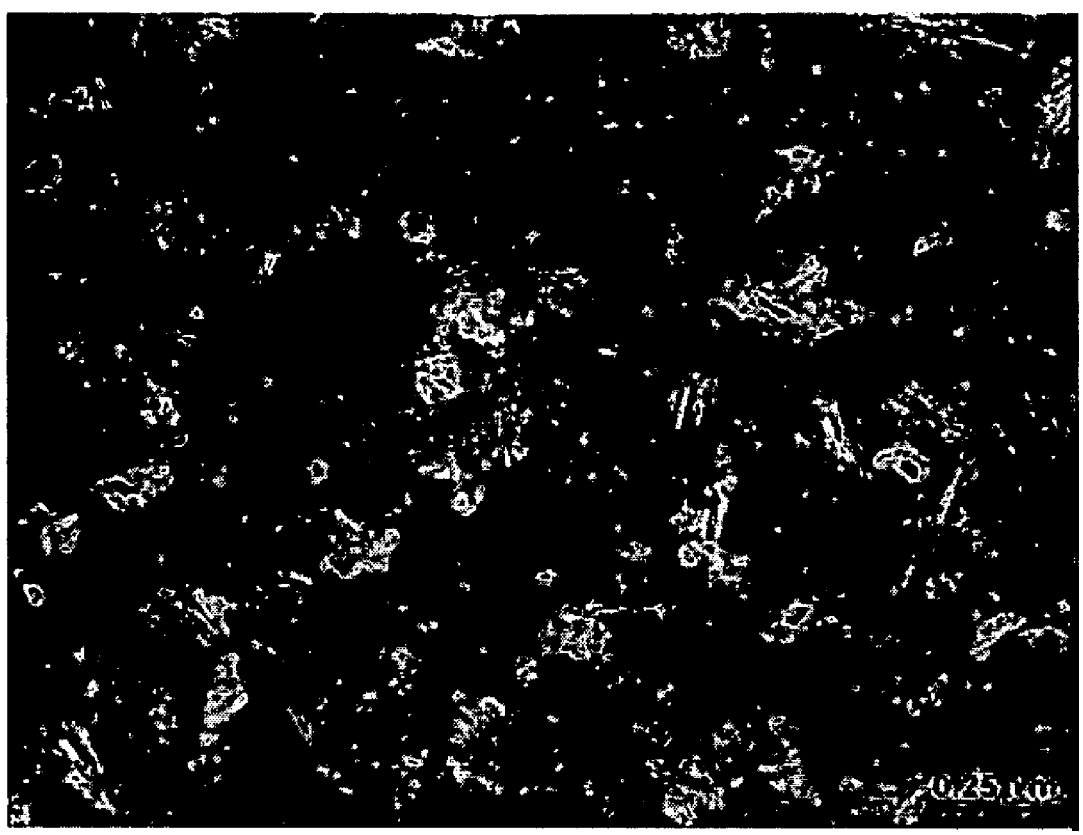

After the 60-second oxidation step, the entire silicon layer was crystallized across the wafer surface. The higher temperature anneal yielded smaller grain size than did the low temperature anneal described earlier, as evident if FIG. 3c, a TEM top view image of a film annealed in a high-temperature anneal, is compared to the films shown in FIGS. 3a and 3b. After the higher temperature anneal, grain sizes were largely less than about 0.25 microns.

Crystallizing anneals in two distinct ranges have been discussed, including a low-temperature anneal performed at temperatures between about 540 and about 650 degrees, and a higher temperature anneal performed between about 800 and about 900 degrees. The lower temperature range maximizes grain size, while the higher temperature range maximizes throughput, since the crystallizing anneal takes place during subsequent processing steps and no separate anneal step is required. It will be understood, however, that films crystallized at temperatures and time periods between those described here will also fall within the scope of the invention. For example, the film can be annealed at more than 650 degrees C. or less than 800 degrees C. for a time period more than 90 seconds and less than twelve hours. It is expected that intermediate conditions will yield intermediate results.

Returning to FIG. 2a, after crystallization of silicon layer 24, fabrication of a preferred thin film transistor can be completed. If silicon layer 24 was crystallized during an oxidation step between 800 and 900 degrees, this oxidation step will have formed oxide layer 26, which is preferably about 2.5 nanometers thick.

If silicon layer 24 was crystallized during a low-temperature anneal, silicon dioxide layer 26 should be formed at this point, preferably by oxidation between 800 and 900 degrees between 45 and 90 seconds. As silicon layer 24 is already fully crystallized at this point, crystal size is not affected by subsequent thermal processing. Alternatively, silicon dioxide layer 26 can be deposited instead. In preferred embodiments, silicon dioxide layer 26 will serve as the tunneling oxide of a SONOS memory cell.

Figure 2B:
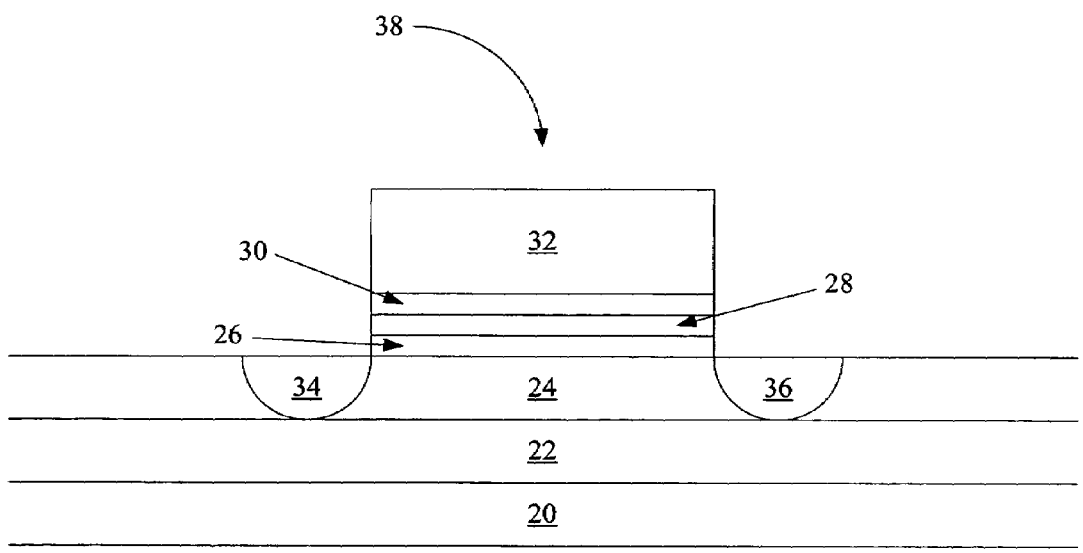

Next nitride layer 28, preferably about 7 nanometers thick, and blocking oxide layer 30, preferably about 5 nanometers thick, are deposited by any conventional means. Gate electrode 32 is formed, preferably of heavily doped polysilicon, then patterned and etched using conventional photolithographic techniques. The completed transistor 38 is shown in FIG. 2b. Source region 34 and drain region 36 are doped by any conventional means, for example by ion implantation. Layers 26, 28, and 30 form an ONO stack which operates as a charge storage region. Layer 28, the nitride layer, is a charge storage dielectric film.

The transistor just described is a SONOS memory cell. A typical SONOS memory cell consists of (from the bottom up) a silicon channel region, a tunneling oxide layer, a nitride charge storage layer, a blocking oxide layer, and a gate electrode, typically of silicon. The silicon-oxide-nitride-oxide-silicon stack gives the device its name, and these conventional materials are used to describe devices using the methods of this invention. Other materials can replace some of the layers, however: Different dielectric materials can be used for the tunneling, charge storage, and blocking dielectric layers, and the gate electrode need not be silicon. The term "SONOS-type device" will be understood to mean a device that operates the same way a SONOS device operates, but which is not necessarily limited to the materials conventionally used in a SONOS device. Mahajani et al., U.S. patent application Ser. No. 10/270,127, "Thin Film Transistor with Metal Oxide Layer and Method of Making Same," filed Oct. 15, 2002, and hereby incorporated by references, describes formation and use of SONOS-type devices made using dielectric materials other than silicon oxide and silicon nitride.

Figure 4:
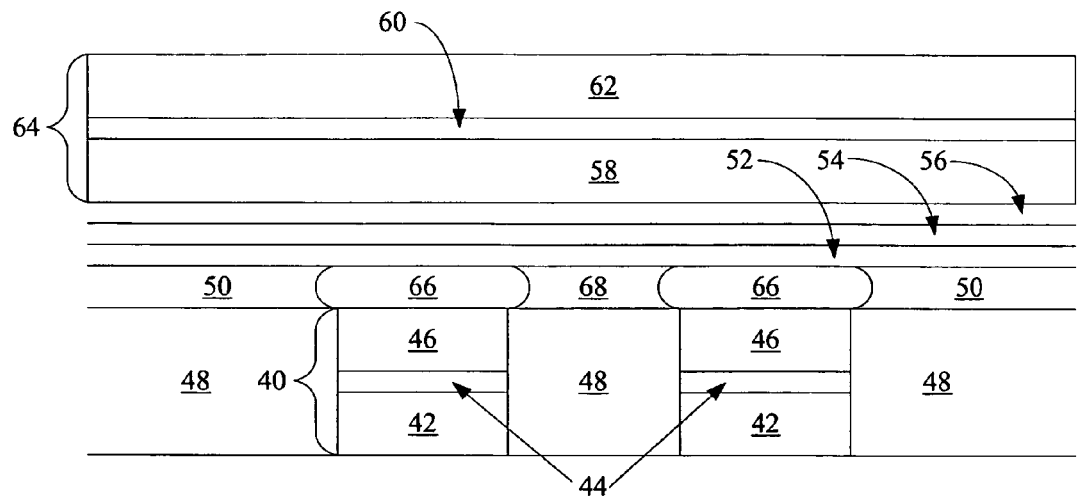
FIG. 4 is a cross-sectional view showing an alternate structure thin film transistor formed according to the present invention.

Transistors of many other types can be formed using a silicon layer deposited and crystallized according to the methods of the present invention. An example of a more complex transistor will be given. Turning to FIG. 4, before formation of a large-grain p-doped polysilicon layer according to the present invention, bitlines 40 are formed. To form bitlines 40, heavily doped polysilicon layer 42 is deposited by any conventional means. Next conductive layer 44 is formed, preferably of titanium silicide, for example by depositing a thin titanium layer, optionally with a thin titanium nitride cap, which will be converted to titanium silicide by subsequent thermal processing. Heavily doped n-type polysilicon layer 46 is formed by any conventional means. Layers 46, 44, and 42 are then patterned and etched to form substantially parallel bitlines 40, here shown in cross-section. Dielectric material 48, for example silicon dioxide, is deposited between and over bitlines 40, then planarization, for example by chemical mechanical polishing, is performed to remove the excess dielectric material 48 and expose the tops of bitlines 40.

Next silicon layer 50 is formed according to the methods of the present invention, preferably about 500 to about 1000 angstroms thick, more preferably about 500 angstroms thick. Layer 50 can be crystallized, for example, in an anneal of about twelve hours performed between about 540 and about 650 degrees C., or, for example in an oxidation step performed between about 800 and about 900 degrees for between about 45 and about 90 seconds; this step, if performed, forms oxide layer 52, which is preferably about 2.5 nanometers thick. If crystallization was performed without an oxidation step, an oxidation step is preferably performed after the anneal to form oxide layer 52. Oxide layer 52 could be deposited instead.

Nitride layer 54, preferably about 7 nanometers thick, and oxide layer 56, preferably about 5 nanometers thick, are formed by any conventional means. A layer of heavily doped semiconductor material 58, for example heavily doped p-type polysilicon, is deposited, followed by a conductive layer 60. This can be any conductive material, for example the same conductive material used in conductive layer 44. Over this another semiconductor layer 62, for example heavily doped p-type silicon, is deposited. The semiconductor layers 58 and 62 and the intervening conductive layer 60 are then patterned and etched to form substantially parallel rails 64, which are substantially orthogonal to bitlines 40, as shown in FIG. 4. A dielectric material, preferably an oxide (not shown), is deposited over and between the rails 64.

To summarize, then, a thin film transistor can be formed by depositing an amorphous semiconductor film, the film in situ doped with a p-type dopant; thermally crystallizing the amorphous film to a polycrystalline film; and forming the thin film transistor, wherein the polycrystalline film serves as a channel region of the thin film transistor. In the same way, a plurality of thin film transistors can be formed having their channel regions in the polycrystalline film.

As has been made clear, this film is formed by crystallizing the film wherein p-type dopant atoms are substantially the only catalyzing agent in contact with or incorporated in the film; no metal catalyst, such as nickel or germanium, need be introduced. Thus the methods described herein can be used to form a device level of thin film transistors comprising an in situ doped polycrystalline film doped with a p-type dopant, wherein the film is fully polycrystalline including substantially no amorphous regions; and a plurality of thin film transistors, wherein the film comprises a plurality of channel regions of the plurality of thin film transistors, and at least about 90 percent by volume of the film consists of grains larger than about 0.2 microns, and wherein the film comprises substantially no catalytic metal.

A monolithic three dimensional memory array formed by stacking levels having the structure just described is taught in more detail in Walker et al., U.S. patent application Ser. No. 10/334,649, "Formation of Thin Channels for TFT Devices to Ensure Low Variability of Threshold Voltages," filed Dec. 31, 2002, hereinafter the '649 application, hereby incorporated by reference. The methods of the present invention could be used to form large-grain p-doped channel regions in multiple levels stacked one above the other to form such a monolithic three dimensional memory array. Such an array can be formed over any suitable substrate, for example over a monocrystalline silicon wafer. Note that details of the '649 have been omitted for clarity in the present discussion, but no teaching of the '649 application is intended to be excluded. As successive memory levels are deposited, thermal processing causes dopants to diffuse upwards from heavily doped layer 46 of bitlines 40, creating source/drain regions 66 (which can be shared between adjacent transistors) in silicon layer 50, with channel region 68 between them.

Transistors like those shown in FIG. 4 were fabricated including a silicon layer deposited and crystallized according to the present invention. The thickness of silicon layer 50 was found to affect carrier mobility and the ratio of on current to off current. Leakage current (current flowing when the transistor is in the "off" state) was found to increase with increasing channel thickness. The leakage current for silicon layer 50 formed about 1000 angstroms thick was about $1 \times 10^{-11}$ amps, which is about two orders of magnitude higher than when the same layer was about 500 angstroms thick.

The devices in which silicon layer 50 was deposited at 460 degrees C. and annealed between about 540 and about 650 degrees had lower leakage current and more uniform IV distribution across the wafer than those deposited at 510 degrees C. and annealed the same way, presumably due to their larger grain size.

When a programming voltage is applied to the gate electrode 58 of a SONOS memory cell, electrons tunnel through the tunnel oxide layer 52 and are trapped in nitride layer 54. When charge is removed from the gate electrode 58, the charge remains trapped. When charge is stored in nitride layer 54, the cell is considered to be programmed. An erase voltage can be applied to cause the stored charge to migrate out of nitride layer 54, and the cell is considered to be erased. The threshold voltage $V_T$ required to turn on the transistor differs depending on whether the cell is programmed or erased; thus the difference in threshold voltage $V_T$ can be used to distinguish a programmed cell from an erased cell. It is advantageous to maximize the difference between programmed and erased threshold voltage $V_T$.

Table 1 summarizes programmed and erased threshold voltages $V_T$ for transistors like those shown in FIG. 4 in which silicon layer 50 was deposited at 460 degrees:

TABLE 1

|  | Low-Temperature Anneal | Higher-Temperature Anneal |
|---|---|---|
| Programmed $V_T$ | 1.15 V | 1.30 V |
| Erased $V_T$ | −0.85 V | −0.30 V |

The column headed "Low-Temperature Anneal" shows median threshold voltage for 60 cells for programmed and erased cells when the anneal was performed at 560 degrees for twelve hours. The column headed "Higher-Temperature Anneal" shows median threshold voltage for 60 cells for programmed and erased cells when the silicon layer was crystallized by an oxidation step performed at 825 degrees for 60 seconds. It will be seen that there is a larger programming window (about 2.0 V) for a low-temperature anneal than for a higher temperature anneal (about 1.6V). It has been noted that it is advantageous to maximize the difference between programmed and erased threshold voltage $V_T$; this goal is better achieved by a low-temperature anneal.

It has been found to be most effective to perform a crystallizing anneal according to the present invention before the amorphous silicon layer to be crystallized has been patterned and etched. After patterning and etching, grain sizes achieved are considerably smaller.

Monolithic three dimensional memory arrays comprising thin film transistors are described in Lee et al., U.S. patent application Ser. No. 09/927,648, "Monolithic Three Dimensional Array of Charge Storage Devices Containing a Planarized Surface," filed Aug. 13, 2001, Cleeves et al., "Optimization of Critical Dimensions and Pitch of Patterned Features in and Above a Substrate," U.S. patent application Ser. No. 10/728,451, Scheuerlein et al., U.S. patent application Ser. No. 10/335,078, "Programmable Memory Array Structure Incorporating Series-Connected Transistor Strings and Methods for Fabrication and Operation of Same," filed Dec. 31, 2002, and Walker et al., U.S. patent application Ser. No. 10/335,089, "Method for Fabricating Programmable Memory Array Structures Incorporating Series-Connected Transistor Strings," filed Dec. 31, 2002, all assigned to the assignee of the present invention and hereby incorporated by reference.

A monolithic three dimensional memory array is one in which multiple memory levels are formed above a single substrate, such as a wafer, with no intervening substrates. The layers forming one memory level are deposited or grown directly over the layers of an existing level or levels. In contrast, stacked memories have been constructed by forming memory levels on separate substrates and adhering the memory levels atop each other, as in Leedy, U.S. Pat. No. 5,915,167, "Three dimensional structure memory." The substrates may be thinned or removed from the memory levels before bonding, but as the memory levels are initially formed over separate substrates, such memories are not true monolithic three dimensional memory arrays.

To summarize, embodiments of the present invention include a method for forming a monolithic three dimensional memory array of thin film transistors, the method comprising depositing a first amorphous silicon film wherein the first film is in situ doped with a p-type dopant; crystallizing the first silicon film; forming a first plurality of thin film transistors wherein each transistor comprises a channel region, the channel region of each first transistor formed in a portion of the first film; and monolithically forming a second plurality of thin film transistors above the first plurality.

The present invention has been described herein in the context of a monolithic three dimensional memory array formed above a substrate. Such an array comprises at least a first memory level formed at a first height above the substrate and a second memory level formed at a second height different from the first height. Three, four, eight, or more or fewer memory levels can be formed above the substrate in such a multilevel array.

As appropriate, the methods and devices of the present invention can be used in any of the monolithic three dimensional memory arrays described in any of the incorporated references.

The large-grain p-doped silicon channel region of the present invention has been describe as used in a SONOS memory device, specifically in monolithic three dimensional memory arrays. It will be apparent, however, that a large-grain silicon film formed according to the present invention will benefit device performance in other types of thin film transistor memory cells and arrays, such as floating gate memory, as well as non-memory transistors.

Figure 5:
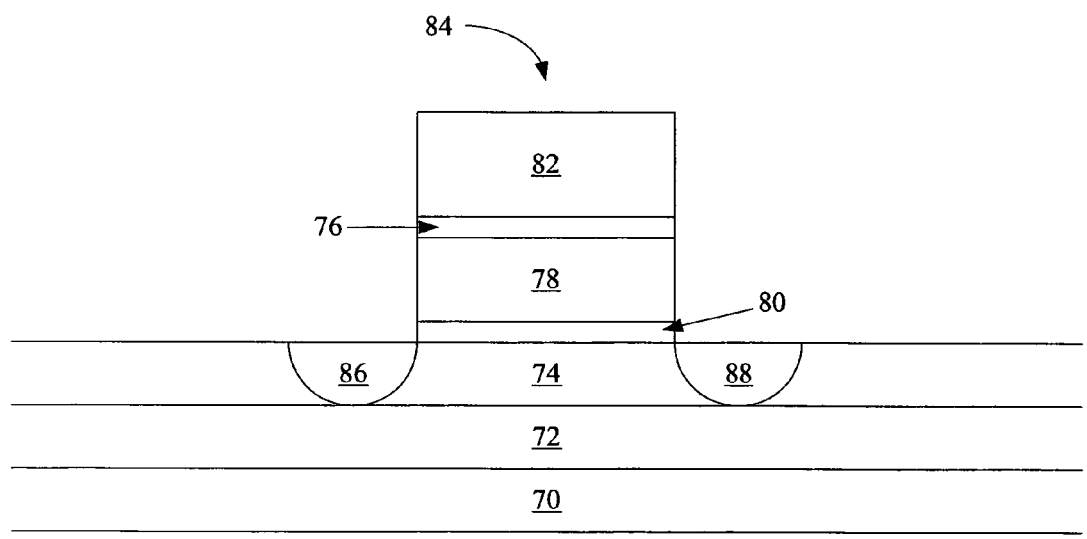
FIG. 5 is a cross-sectional view showing a floating gate thin film transistor formed according to the present invention.

FIG. 5, for example, shows an exemplary floating gate memory cell 84 formed according to the present invention. Layer 70 is a suitable substrate, for example a monocrystalline silicon wafer. A dielectric layer 72, for example silicon dioxide, isolates subsequent layers from substrate 70. Layers 20 and 22 are a representation of one possibility; additional layers may be present, of course.

Layer 74 is a p-doped silicon layer deposited and annealed according to the methods of the present invention. Layer 76 is a gate dielectric, for example an oxide layer. Oxide layer 76 can be formed during the anneal that crystallizes silicon layer 74, or can be formed subsequently, either by oxidation or deposition. Floating gate 78 is formed by any conventional means, preferably of polysilicon. Blocking dielectric layer 80 is formed by conventional means. This layer can be a single dielectric layer, such as an oxide, or may comprise more than one dielectric layer. A gate electrode layer 82, preferably of doped polysilicon, is formed by any conventional means. Layers 82, 80, 78, and 76 are patterned and etched as shown. Source and drain regions 84 and 86 are doped by any conventional means, for example by ion implantation.

Two-dimensional memory arrays, formed on a single level, can benefit from the methods of the present invention as well.

Detailed methods of fabrication have been described herein, but any other methods that form the same structures can be used while the results fall within the scope of the invention.

The foregoing detailed description has described only a few of the many forms that this invention can take. For this reason, this detailed description is intended by way of illustration, and not by way of limitation. It is only the following claims, including all equivalents, which are intended to define the scope of this invention.

What is claimed is:

1. A method for forming an array of thin film transistors, the method comprising:

depositing an amorphous semiconductor film by an LPCVD process wherein the film is in situ doped with a p-type dopant;

implanting hydrogen into the amorphous semiconductor film;

crystallizing the film; and forming a plurality of thin film transistors, each thin film transistor comprising a channel region, each channel region comprising a portion of the crystallized film;

wherein the each of the plurality of thin film transistors comprises a charge storage region and the plurality of thin film transistors are SONOS-type memory cells.

2. The method of claim 1 wherein the crystallizing step comprises exposing the amorphous film comprising an amorphous silicon film to a crystallizing temperature about 540 degrees C. or greater.

3. The method of claim 2 wherein the crystallizing temperature is between about 540 and about 650 degrees C.

4. The method of claim 3 wherein the film is exposed to the crystallizing temperature for no more than about 24 hours.

5. The method of claim 4 wherein the film is exposed to the crystallizing temperature for no more than about twelve hours.

6. The method of claim 2 wherein the crystallizing temperature is between about 800 and about 900 degrees C.

7. The method of claim 6 wherein the film is exposed to the crystallizing temperature for between about 45 and about 60 seconds.

8. The method of claim 6 wherein the crystallizing step comprises thermally growing an oxide on the film.

9. The method of claim 1 wherein the film is doped to a dopant concentration between about $2 \times 10^{17}$ and about $2 \times 10^{18}$ atoms/cm$^3$.

10. The method of claim 1 wherein the p-type dopant is boron.

11. The method of claim 1 wherein, during the crystallizing step, the film is not exposed to a catalytic metal.

12. The method of claim 1 wherein the depositing step is performed at a deposition temperature between about 460 and about 530 degrees C.

13. The method of claim 12 wherein the depositing step is performed at a deposition temperature between about 460 and about 520 degrees C.

14. The method of claim 1 wherein the crystallizing step does not include a laser annealing step.

15. The method of claim 1 wherein the crystallizing step comprises crystallizing substantially the entire film.

16. The method of claim 1 wherein the crystallizing step comprises crystallizing the film by solid phase crystallization.

17. A method for forming an array of thin film transistors, the method comprising:

depositing an amorphous silicon film by an LPCVD process wherein the film is in situ doped with a p-type dopant by using BCl$_3$ gas;

crystallizing the film wherein p-type dopant atoms are substantially the only catalyzing agent in contact with or incorporated in the film; and forming a plurality of thin film transistors wherein a channel region of each transistor comprises a portion of the crystallized film;

wherein the each of the plurality of thin film transistors comprises a charge storage region and the plurality of thin film transistors are SONOS-type memory cells.

18. The method of claim 17 wherein the crystallizing step comprises exposing the amorphous film to a crystallizing temperature about 540 degrees C. or greater.

19. The method of claim 18 wherein the crystallizing temperature is between about 540 and about 650 degrees C.

20. The method of claim 19 wherein the film is exposed to the crystallizing temperature for no more than about 24 hours.

21. The method of claim 19 wherein the film is exposed to the crystallizing temperature for no more than about twelve hours.

22. The method of claim 18 wherein the crystallizing temperature is between about 800 and about 900 degrees C.

23. The method of claim 22 wherein the film is exposed to the crystallizing temperature for between about 45 and about 60 seconds.

24. The method of claim 23 wherein the crystallizing step comprises thermally growing an oxide on the film.

25. The method of claim 17 wherein the p-type dopant is boron.

26. The method of claim 17 wherein, during the crystallizing step, the film is not exposed to a catalytic metal.

27. The method of claim 17 wherein the depositing step is performed at a deposition temperature between about 460 and about 530 degrees C.

28. The method of claim 27 wherein the depositing step is performed at a deposition temperature between about 460 and about 520 degrees C.

29. The method of claim 17 wherein the crystallizing step does not include a laser annealing step.

30. The method of claim 17 wherein the crystallizing step comprises crystallizing substantially the entire film.

31. The method of claim 17 wherein the crystallizing step comprises crystallizing the film by solid phase crystallization.

32. The method of claim 17 wherein the film is doped to a dopant concentration between about $2 \times 10^{17}$ and about $2 \times 10^{18}$ atoms/cm$^3$.

33. The method of claim 17, further comprising implanting hydrogen into the amorphous silicon film.

34. A method for forming a monolithic three dimensional memory array of thin film transistors, the method comprising:

depositing a first amorphous silicon film by an LPCVD process wherein the first film is in situ doped with a p-type dopant;

crystallizing the first silicon film;

forming a first plurality of thin film transistors wherein each transistor comprises a channel region, the channel region of each first transistor formed in a portion of the first film; and monolithically forming a second plurality of thin film transistors above the first plurality.

35. The method of claim 34 wherein the crystallizing step comprises exposing the amorphous film to a crystallizing temperature about 540 degrees C. or greater.

36. The method of claim 35 wherein the crystallizing temperature is between about 540 and about 650 degrees C.

37. The method of claim 36 wherein the film is exposed to the crystallizing temperature for no more than about 24 hours.

38. The method of claim 37 wherein the film is exposed to the crystallizing temperature for no more than about twelve hours.

39. The method of claim 35 wherein the crystallizing temperature is between about 800 and about 900 degrees C.

40. The method of claim 39 wherein the film is exposed to the crystallizing temperature for between about 45 and about 60 seconds.

41. The method of claim 39 wherein the crystallizing step comprises thermally growing an oxide on the film.

42. The method of claim 34 wherein the film is doped to a dopant concentration between about $2 \times 10^{17}$ and about $2 \times 10^{18}$ atoms/cm$^3$.

43. The method of claim 34 wherein the p-type dopant is boron.

44. The method of claim 34 wherein, during the crystallizing step, the first film is not exposed to a catalytic metal.

45. The method of claim 34 wherein the depositing step is performed at a deposition temperature between about 460 and about 530 degrees C.

46. The method of claim 34 wherein the depositing step is performed at a deposition temperature between about 460 and about 520 degrees C.

47. The method of claim 34 wherein the crystallizing step does not include a laser annealing step.

48. The method of claim 34 wherein each of the first plurality of thin film transistors comprises a charge storage region.

49. The method of claim 48 wherein the first plurality of thin film transistors are SONOS-type memory cells.

50. The method of claim 34 wherein the crystallizing step comprises crystallizing substantially the entire film.

51. The method of claim 34 wherein the crystallizing step comprises crystallizing the film by solid phase crystallization.

* * * * *